(12) United States Patent
Liao et al.

(10) Patent No.: US 6,239,640 B1
(45) Date of Patent: May 29, 2001

(54) DOUBLE EDGE TRIGGER D-TYPE FLIP-FLOP

(75) Inventors: Stanley Liao; Horng-Jyh Liu; Hsing-yi Chen, all of Hsinchu (TW)

(73) Assignee: Silicon Integrated Systems Corporation (TW)

( * ) Notice: Subject to any disclaimer, the term of this patent is extended or adjusted under 35 U.S.C. 154(b) by 0 days.

(21) Appl. No.: 09/286,832

(22) Filed: Apr. 6, 1999

(30) Foreign Application Priority Data

Feb. 23, 1999 (TW) .................................................. 88202833

(51) Int. Cl.[7] .................................................... H03K 3/356
(52) U.S. Cl. ............................................. 327/218; 327/211
(58) Field of Search .................................. 327/199–203, 327/208, 210–212, 215, 218

(56) References Cited

U.S. PATENT DOCUMENTS

| | | | |
|---|---|---|---|
| 5,281,865 | * | 1/1994 | Yamashita et al. .................. 327/203 |
| 5,767,716 | * | 6/1998 | Ko ....................................... 327/203 |
| 5,867,049 | * | 2/1999 | Mohd .................................. 327/200 |

* cited by examiner

*Primary Examiner*—Kenneth B. Wells
(74) *Attorney, Agent, or Firm*—Merchant & Gould P.C.

(57) ABSTRACT

The present invention provides a double edge trigger D-type flip-flop which can be both triggered at the rising edge and falling edge of a clock. That is to say, the double edge trigger D-type flip-flop of the present invention can access data twice in a clock cycle. Therefore, the double edge trigger D-type flip-flop of the present invention is capable of providing a double accessed data amount than that of a conventional rising (or falling) edge trigger D-type flip-flop, thereby significantly increasing the efficiency of the system.

2 Claims, 3 Drawing Sheets

DOUBLE EDGE TRIGGER D-TYPE FLIP-FLOP

FIELD OF THE INVENTION

The present invention generally relates to a flip-flop, and more particularly, to a double edge trigger D-type flip-flop.

BACKGROUND OF THE INVENTION

A conventional flip-flop is triggered either at the rising edge (or positive level) or the falling edge (negative level) of a clock cycle. The structure of the conventional rising edge trigger D-type flip-flop mainly consists of inverters and tri-state inverters. The basic circuit structure of a tri-state inverter is illustrated in FIG. 1. The operation of the tri-state inverter is described as follows: when the clock control signal CKP is logical "0" (the inverted clock control signal CKN is now logical "1"), the tri-state inverter is acted as an inverter; on the contrary, when the clock control signal CKP is logical "1" (the inverted clock control signal CKN is now logical "0"), the output Z of the tri-state inverter is floating (i.e., high impedance). Such a circuit is so-called a "tri-state inverter" due to the output thereof having three states, i.e., "0", "1" and "floating".

Referring to FIG. 2, it illustrates the circuit structure of a conventional rising edge trigger D-type flip-flop. The rising edge trigger D-type flip-flop consists of two tri-state inverters (20, 22), two latches (21, 23), clock control signal (CK) and inverted clock control signal (CKB). Latch (21) consists of two inverters (211, 212), wherein the output Z of the inverter (211) is connected to the input A of the inverter (212) and the output of the inverter (212) is connected to the input of the inverter (211). Such a connection forms a positive feedback circuit. Therefore, the value of the output N2 of the latch (21) can be maintained even if the input NI of the latch (21) is floating. The circuit structure of latch (23) is similar to that of latch (21).

The operation of the conventional rising edge trigger D-type flip-flop is described as follows: when the clock control signal CK is logical "0" (the inversed clock control signal CKB is now logical "1"), the tri-state inverter (20) is acted as an inverter and the other tri-state inverter (22) is floating ( i.e., the output N3 of the tri-state inverter (22) has a high impedance), therefore, the input D is inversed by tri-state inverter (20) and latched in latch 1 (21) but cannot be transmitted to latch 2 (23); when the clock control signal CK is changed from logical "0" to logical "1" (the inversed clock control signal CKB is now changed from logical "1" to logical "0"), the tri-state inverter (22) is acted as an inverter and the other tri-state inverter (20) is floating, therefore, the input D cannot be latched in latch 1 (21) and the data previously latched in latch 1 (21) is inversed by tri-state inverter (22) and latched in latch 2 (23) and finally transmitted to output Q of the flip-flop.

Therefore, the conventional rising edge D-type flip-flop is capable of performing one bit access during a clock cycle. However, the operation is merely performed at the rising edge of a clock and cannot be performed at the falling edge of the clock. Therefore, there is a need to overcome such an inefficient operation.

SUMMARY OF THE INVENTION

To overcome the aforementioned problems, it is an object of the present invention to provide a double edge trigger D-type flip-flop which can be both triggered at the rising edge and falling edge of a clock. That is to say, the double edge trigger D-type flip-flop of the present invention can access data twice in a clock cycle. Therefore, the double edge trigger D-type flip-flop of the present invention is capable of providing a double accessed data amount than that of a conventional rising (or falling) edge trigger D-type flip-flop, thereby significantly increasing the efficiency of the system.

BRIEF DESCRIPTION OF THE DRAWINGS

For a more complete understanding of the present invention and the advantages thereof, reference is now made to the following descriptions taken in conjunction with the accompanying drawings which illustrate one or more embodiments of the present invention, wherein.

DETAILED DESCRIPTION OF THE PREFERRED EMBODIMENTS

Figure 1:
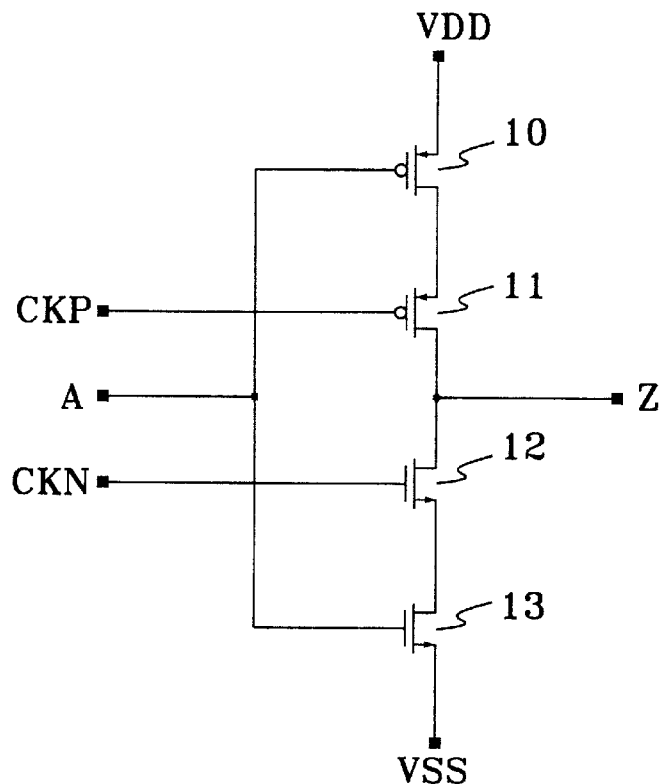
FIG. 1 illustrates a circuit diagram of a conventional tri-state inverter.
Figure 2:
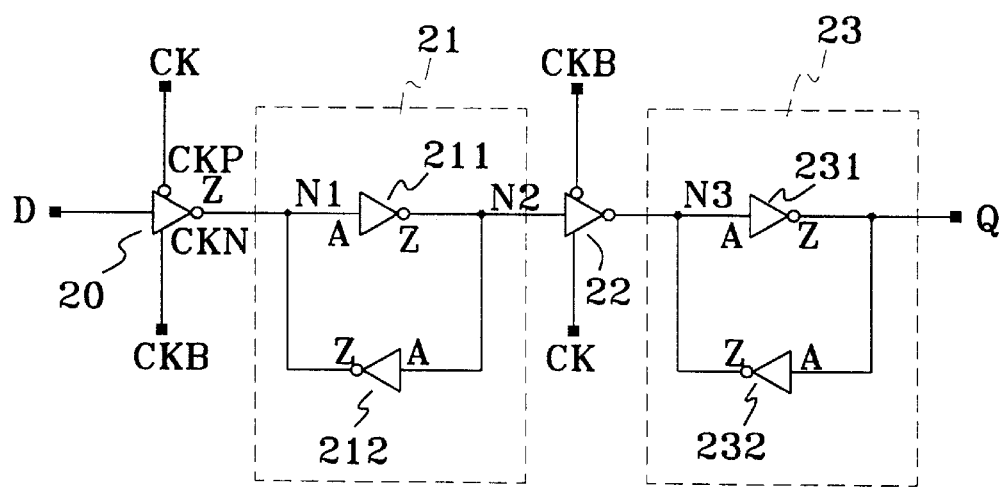
FIG. 2 illustrates a circuit diagram of a conventional rising edge trigger D-type flip-flop.
Figure 3:
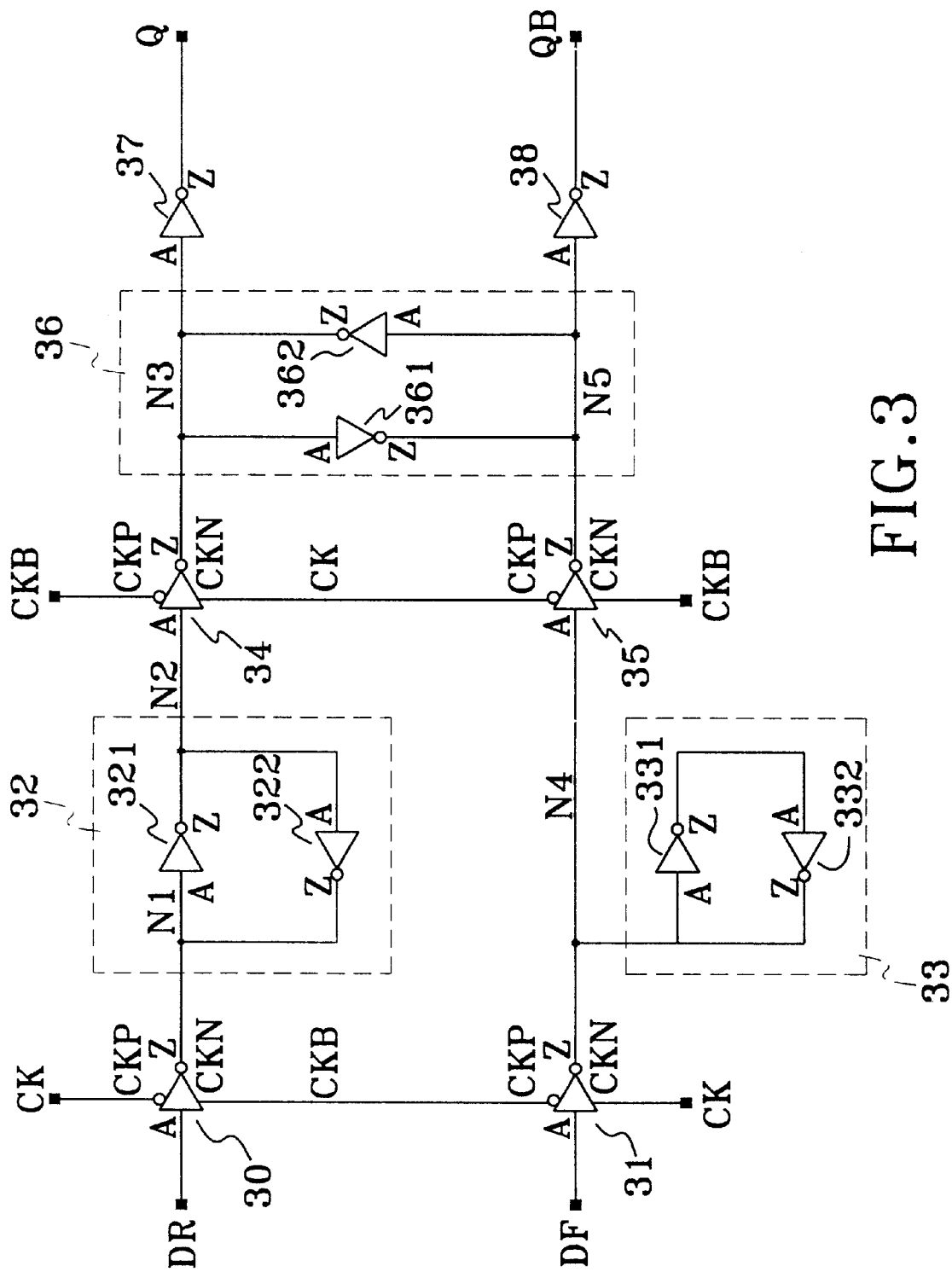
FIG. 3 illustrates a circuit diagram of the double edge trigger D-type flip-flop of the present invention.

Referring to FIG. 3, it illustrates a circuit diagram of the double edge trigger D-type flip-flop of the present invention, wherein the double edge trigger D-type flip-flop consists of two inputs (DR, DF), but the two inputs can be combined into one input depending on different applications, three latches (32, 33 and 36) and two outputs (Q, QB). The inputs (DR, DF) are respectively coupled to a first tri-state inverter (30) and a second tri-state inverter (31) controlled by a clock control signal (CK) and an inversed clock control signal (CKB) respectively. The outputs of the first tri-state inverter (30) and second tri-state inverter (31) are respectively coupled to a first latch (32) consisting of two inverters (321, 322) and a second latch (33) consisting of two inverters (331, 332). The outputs of the first latch (32) and second latch (33) are respectively coupled to a third tri-state inverter (34) and a fourth tri-state inverter (35) controlled by a clock control signal (CK) and an inversed clock control signal (CKB) respectively. The outputs of the third tri-state inverter (34) and fourth tri-state inverter (35) are acted as the output Q and inversed output QB of the double edge trigger D-type flip-flop of the present invention. The clock control signals (CK) and the inverted clock control signals (CKB) in FIG. 3 are synchronously operated.

In addition, the double edge trigger D-type flip-flop of the present invention further comprises a third latch (36) consisting of two inverters (361, 362) for latching the outputs of the third tri-state inverter (34) and fourth tri-state inverter (35). The third latch (36) further comprises two inverters (37, 38) for respectively coupling to the outputs of the third tri-state inverter (34) and fourth tri-state inverter (35) so as to respectively inverse the output values of the third tri-state inverter (34) and fourth tri-state inverter (35) and then couple the inversed outputs to the output Q and inversed output QB of the double edge trigger D-type flip-flop of the present invention.

The operation of the double edge trigger D-type flip-flop of the present invention is described as follows:

When the clock control signal CK is logical "0" (the inversed clock control signal CKB is now logical "1"), tri-state inverters (30, 35) are acted as inverters and tri-state inverters (31, 34) are floating ( i.e., output N4 and N3 of tri-state inverters (31, 34) have a high impedance), therefore, the input DR is inverted by tri-state inverter (30) and latched in latch 1 (32) but cannot be transmitted to latch 3 (36); the data previously latched in latch 2 (33) is inversed by tri-state inverter (35) and latched in latch 3 (36) and finally transmitted to output Q of the flip-flop.

Figure 4:
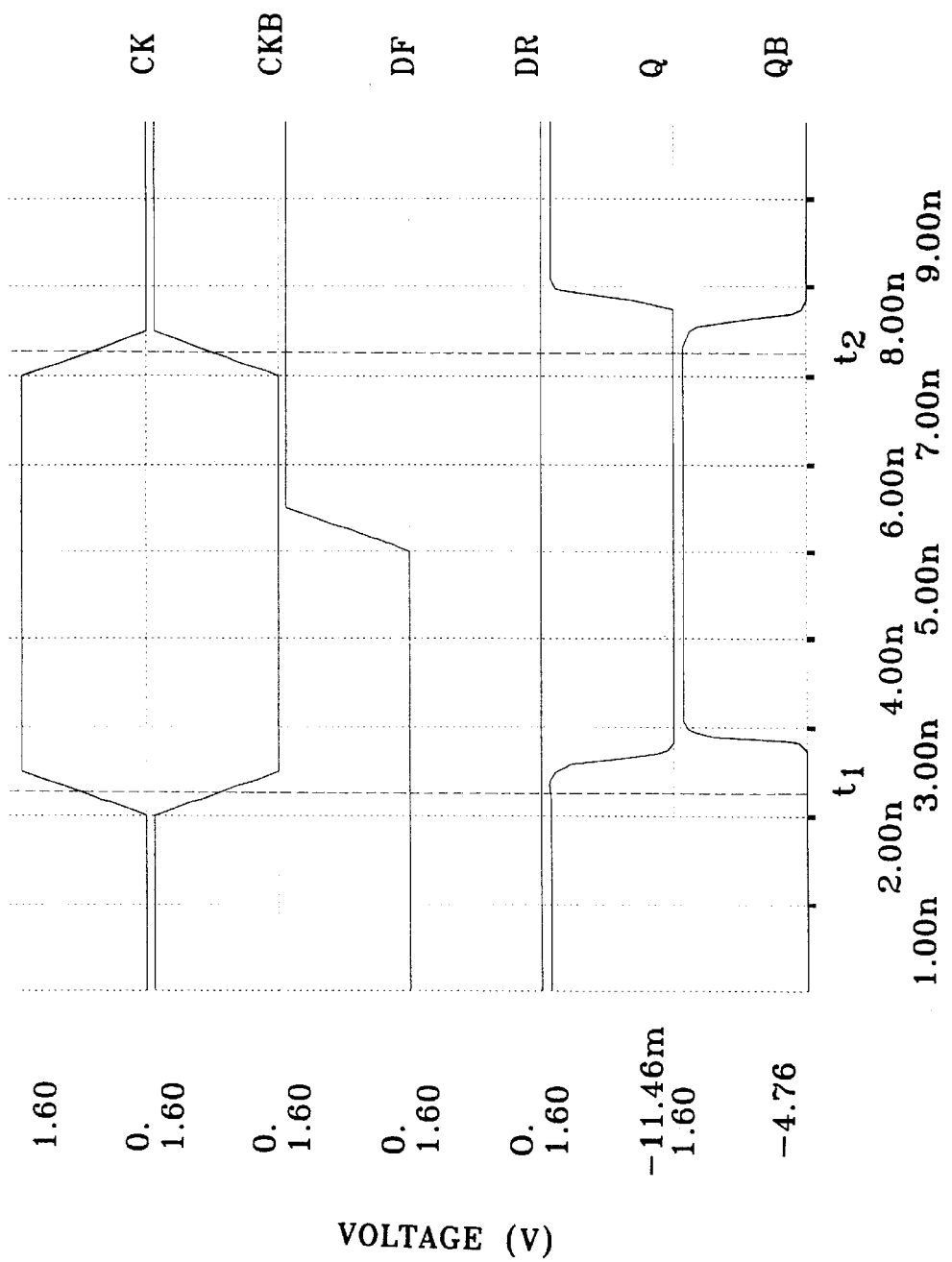
FIG. 4 illustrates a timing diagram showing the operation of the double edge trigger D-type flip-flop of the present invention.

Referring to FIG. 4, FIG. 4 illustrates a timing diagram showing the operation of the double edge trigger D-type flip-flop of the present invention. When t=$t_1$, the clock control signal CK is changed from logical "0" to logical "1" (the inversed clock control signal CKB is now changed from logical "1" to logical "0"), the tri-state inverters (34, 31) are acted as inverters and the other tri-state inverters (30, 35) are floating, therefore, input DR cannot be latched in latch 1 (32) via tri-state inverter (30) and the data previously latched in latch 1 (32) is latched in latch 3 (36) via tri-state inverter (34) and finally transmitted to output Q and QB of the flip-flop. At the same time, input DF is latched in latch 2 (33) via tri-state inverter (31) and cannot be latched in latch 3 (36) via tri-state inverter (35). The above access operation is performed at the rising edge of the clock control signal CK.

When t=$t_2$, the clock control signal CK is changed from logical "1" to logical "0" (the inversed clock control signal CKB is now changed from logical "0" to logical "1"), the tri-state inverters (30,35) are now acted as inverters and the other tri-state inverters (34, 31) are now floating, therefore, input DF cannot be latched in latch 2 (33) via tri-state inverter (31) and the data previously latched in latch 2 (33) is latched in latch 3 (36) via tri-state inverter (35) and finally transmitted to output Q and QB of the flip-flop. At the same time, input DR is latched in latch 1 (32) via tri-state inverter (30) and cannot be latched in latch 3 (36) via tri-state inverter (34). The above access operation is performed at the falling edge of the clock control signal CK.

In summary, the double edge trigger D-type flip-flop of the present invention can access data both at the rising edge and falling edge of a clock cycle. Therefore, the double edge trigger D-type flip-flop of the present invention is capable of providing a double accessed data amount than that of a conventional rising (or falling) edge trigger D-type flip-flop, thereby significantly increasing the efficiency of the system.

Although the present invention and its advantage have been described in detail, it should be understood that various changes, substitutions and alternations can be made herein without departing from the spirit and scope of the invention as defined by the appended claims.

What is claimed is:

1. A double edge trigger flip-flop, comprising at least two inputs and at least three latches, wherein a first input and a second input are respectively coupled to a first tri-state inverter controlled by a clock control signal and a second tri-state inverter controlled by an inverted clock control signal, outputs of the first tri-state inverter and the second tri-state inverter are respectively coupled to a first latch and a second latch, outputs of the first latch and the second latch are respectively coupled to a third tri-state inverter controlled by the clock control signal and a fourth tri-state inverter controlled by the inverted clock control signal, outputs of the third tri-state inverter and the fourth tri-state inverter are respectively coupled to a first input and a second input of a third latch, a first output and a second output of the third latch are respectively an output and inverted output of the double edge trigger flip-flop.

2. A double edge trigger flip-flop, comprising at least two inputs and at least three latches, wherein a first input and a second input are respectively coupled to a first tri-state inverter controlled by a clock control signal and a second tri-state inverter controlled by an inverted clock control signal, outputs of the first tri-state inverter and the second tri-state inverter are respectively coupled to a first latch and a second latch, outputs of the first latch and the second latch are respectively coupled to a third tri-state inverter controlled by the clock control signal and a fourth tri-state inverter controlled by the inverted clock control signal, outputs of the third tri-state inverter and the fourth tri-state inverter are respectively coupled to a first input and a second input of a third latch, wherein the third latch consists of two inverters, a first output and a second output of the third latch are respectively an output and inverted output of the double edge trigger flip-flop.

* * * * *